(12) United States Patent
Tuominen et al.

(10) Patent No.: US 8,487,194 B2
(45) Date of Patent: Jul. 16, 2013

(54) CIRCUIT BOARD INCLUDING AN EMBEDDED COMPONENT

(75) Inventors: Risto Tuominen, Espoo (FI); Petteri Palm, Helsinki (FI)

(73) Assignee: Imbera Electronics Oy, Espoo (FI)

( * ) Notice: Subject to any disclaimer, the term of this patent is extended or adjusted under 35 U.S.C. 154(b) by 447 days.

(21) Appl. No.: 12/702,653

(22) Filed: Feb. 9, 2010

(65) Prior Publication Data

US 2010/0202115 A1 Aug. 12, 2010

Related U.S. Application Data

(63) Continuation-in-part of application No. 11/659,190, filed as application No. PCT/FI2005/000352 on Aug. 4, 2005, now Pat. No. 7,673,387.

(51) Int. Cl.
*H05K 1/16* (2006.01)

(52) U.S. Cl.
USPC ............................................ 174/260; 174/261

(58) Field of Classification Search
None
See application file for complete search history.

(56) References Cited

U.S. PATENT DOCUMENTS

| | | | |
|---|---|---|---|
| 4,246,595 A | 1/1981 | Noyori et al. | |
| 5,248,852 A | 9/1993 | Kumagai | |
| 5,497,033 A | 3/1996 | Fillion et al. | |
| 6,038,133 A | 3/2000 | Nakatani et al. | |
| 6,154,366 A | 11/2000 | Ma et al. | |
| 6,271,469 B1 | 8/2001 | Ma et al. | |
| 6,284,564 B1 | 9/2001 | Balch et al. | |
| 6,324,067 B1 * | 11/2001 | Nishiyama | 361/761 |
| 6,362,436 B1 * | 3/2002 | Kimbara et al. | 174/260 |
| 6,475,877 B1 | 11/2002 | Saia et al. | |
| 6,489,685 B2 | 12/2002 | Asahi et al. | |
| 6,506,632 B1 * | 1/2003 | Cheng et al. | 438/126 |
| 6,701,614 B2 | 3/2004 | Ding et al. | |
| 6,876,072 B1 | 4/2005 | Wang et al. | |
| 6,991,966 B2 | 1/2006 | Tuominen | |
| 7,002,245 B2 * | 2/2006 | Huang et al. | 257/701 |
| 7,294,529 B2 | 11/2007 | Tuominen | |
| 2002/0117743 A1 | 8/2002 | Nakatani et al. | |
| 2003/0159852 A1 | 8/2003 | Nakamura | |
| 2006/0278967 A1 | 12/2006 | Tuominen et al. | |

FOREIGN PATENT DOCUMENTS

| | | |
|---|---|---|
| EP | 0 920 058 A | 6/1999 |
| EP | 1 111 662 A | 6/2001 |
| JP | 2004-146634 | 5/2004 |
| WO | WO 03/065778 A1 | 8/2003 |

* cited by examiner

*Primary Examiner* — Ishwarbhai Patel
(74) *Attorney, Agent, or Firm* — Birch, Stewart, Kolasch & Birch, LLP.

(57) ABSTRACT

The document describes a circuit board and an electronic module, including a conductor-pattern layer, an insulating-material layer supporting the conductor-pattern layer, and at least one component inside the insulating-material layer. The component has a plurality of contact areas and the circuit board or electronic module includes contact elements between the conductor-pattern layer and contact areas for electrically connecting the conductor-pattern layer and the at least one component such that at least two of the contact elements are in direct contact with a common contact area.

20 Claims, 8 Drawing Sheets

CIRCUIT BOARD INCLUDING AN EMBEDDED COMPONENT

This application is a Continuation-in-Part of copending application Ser. No. 11/659,190 filed on Feb. 2, 2007, which is a National Phase of PCT/FI05/00352, filed Aug. 4, 2005, which claims priority to Application No. 20041059 filed in Finland on Aug. 5, 2004. The entire contents of all of the above applications is hereby incorporated by reference into the present application.

The present invention relates to circuit boards containing a component.

Layers containing a component are manufactured, for example, when making multi-layer circuit boards or other similar electronic modules. The present invention relates to circuit boards that include a layer, which contains one or more components, which are connected electrically to a circuit external to the layer, or to each other, through conductor structures made in the electronic module. In this document, such a layer will be referred to as a circuit-board layer.

Patent publication U.S. Pat. No. 6,489,685 discloses one solution, in which components are placed inside a circuit board during the creation of the circuit board. In the solution, conductor patterns are made on top of a support base and the component is connected to the manufactured conductor patterns. After this, an insulating layer, on the surface of which there can be additional conductor pattern layers, acting as the base material of the circuit board, is formed on top of the conductor patterns and the component. After the creation of the insulating layer, the support base is detached from the construction.

Patent publication U.S. Pat. No. 6,038,133 discloses not only a method similar to that described above, but also a second solution, in which components are placed inside a circuit board during the creation of the circuit board. In the second solution, the components are glued, using an electrically conductive adhesive, to copper foil and after this an insulating layer acting as the base material of the circuit board is formed on top of the copper foil and the component. After forming the insulating layer, conductor patterns are made from the copper foil.

The electrical properties of a contact made with the aid of an electrically conductive adhesive are not particularly good, so that the methods disclosed in the publications U.S. Pat. No. 6,489,685 and U.S. Pat. No. 6,038,133 are not suitable for many such applications, wherein the electrical properties are critical.

The invention is intended to create a new circuit-board layer with contacts that are reliable and have high-quality electrical properties to the contact bumps or other contact areas of a component.

According to an aspect of the invention, there is provided a circuit board, comprising a conductor-pattern layer and an insulating-material layer supporting the conductor-pattern layer. The circuit board further comprises at least one component inside the insulating-material layer, the component having a plurality of contact areas. The circuit board further comprises a set of contact elements between the conductor-pattern layer and contact areas for electrically connecting the conductor-pattern layer and the at least one component, wherein the set of contact elements comprise a plurality of individual contact elements for at least one single contact area in said plurality of contact areas.

According to another aspect of the invention, there is provided a circuit board, comprising a conductor-pattern layer, an insulating-material layer supporting the conductor-pattern layer, and at least one component inside the insulating-material layer. The component has a plurality of contact areas and the circuit board comprises contact elements between the conductor-pattern layer and contact areas for electrically connecting the conductor-pattern layer and the at least one component such that at least two of the contact elements are in direct contact with a common contact area.

According to a further aspect of the invention, there is provided an electronic module, comprising an insulating-material layer and at least one semiconductor component inside the insulating-material layer. The semiconductor component has a plurality of contact areas. The electronic module further comprises a conductor-pattern layer running over the insulating-material layer and comprising a plurality of conductors. The electronic module further comprises contact elements between the conductor-pattern layer and contact areas, wherein at least one of the conductors is electrically connected to an individual contact area via a plurality of said contact elements.

In an embodiment, the circuit boards are manufactured by attaching the component or components of the circuit board being manufactured to a conductor layer, which at this stage has not yet been patterned to form a conductor-pattern layer. The conductor layer is aligned relative to the base surface and attached to the base surface with the aid of an insulating material, in such a way that the component or components face the base surface and the components are located inside the insulating material. The electrical contacts between the contact areas of the component and the conductor-pattern layer are formed in such a way that, at the location of the contact areas of the component, contact openings are opened and a conductor material is formed in the contact openings. The conductor material is manufactured preferably using a chemical and/or electrochemical metallization method. After this, the conductor layer is patterned to form a conductor-pattern layer and the necessary vias are made between the conductor-pattern layer and the conductor patterns of the base surface.

Considerable advantages are gained with the aid of the invention.

Using the method according to the invention, it is possible to add the desired number of circuit-board layers to the surface of circuit boards or other electronic modules. Using the method according to the invention, circuit-board layer can also be added to other surfaces, which include conductor patterns.

Using the method according to the invention, it is also possible to manufacture high-quality and reliable electrical contacts to the contact bumps or other contact areas of a component. This is based on the fact that, when making the contacts, it is possible to use, for example, some microvia method known in the circuit-board industry and found to be reliable. The contacts can be made, for example, in such a way that the contact areas are first cleaned, for example, with the aid of a laser or plasma and after this metal is grown in the contact openings, using a chemical and/or electrochemical metallization method.

In the following, the invention is examined with the aid of examples and with reference to the accompanying drawings.

Figure 1:
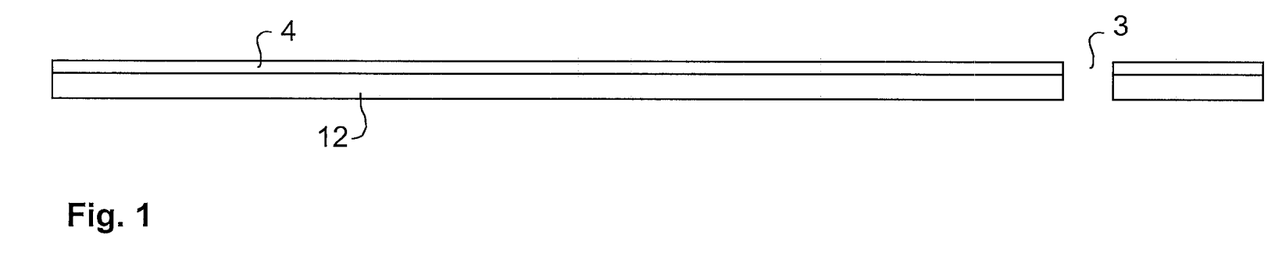
FIG. 1 shows a conductor membrane used as a starting material in the manufacture of a circuit-board layer in one embodiment of the invention.

In the methods according to the embodiments, manufacture can start, for example, from a bare conductor layer 4, which can be, for example, a metal layer. Copper foil (Cu) is one material suitable for manufacturing the conductor layer 4. If the conductor membrane 4 selected for the process is very thin, or the conductor membrane is not mechanically durable for other reasons, it is recommended that the conductor membrane 4 be supported with the aid of a support layer 12 (FIG. 1). It is then possible to proceed, for example, in such a way that the process commences from the manufacture of the support layer 12. The support layer 12 can be, for example, of an electrically conductive material, such as aluminium (Al), steel, or copper, or of an insulating material, such as a polymer. On the other side of the support layer 12, it is possible to manufacture an unpatterned conductor layer 4, for example, by using some manufacturing method well known in the circuit-board industry. The conductor layer can be made, for example, by laminating copper foil (Cu) on the surface of the support layer 12. Alternatively, it is possible to proceed in such a way that the support layer 12 is made on the surface of the conductor layer 4. The conductor membrane 4 can also be a surfaced metal membrane, or some other membrane containing several layers or several materials.

Manufacture can also be commenced, for example, from a conductor layer 4, on the first surface of which there is an insulating-material layer 1 (not shown). In that case, the first surface is the surface on that side to which the component, which is enclosed inside the insulating layer 1, is attached. In some embodiments, on the opposite surface to this insulating layer 1 there can be yet another conductor layer 4. If a support layer 12 is used in the embodiment, the support layer 12 will be on the opposite surface of the conductor layer 4, i.e. on the first surface. In that case, holes or recesses are made in the insulating-material layer 1 for the components that are to be embedded. The recesses can be made either before the insulating-material layer 1 and the conductor layer 4 are attached to each other, or else after the attachment. In the manufacture of the recesses, some machining method known in the circuit-board industry, for example milling or laser drilling, can be used.

Figure 3:
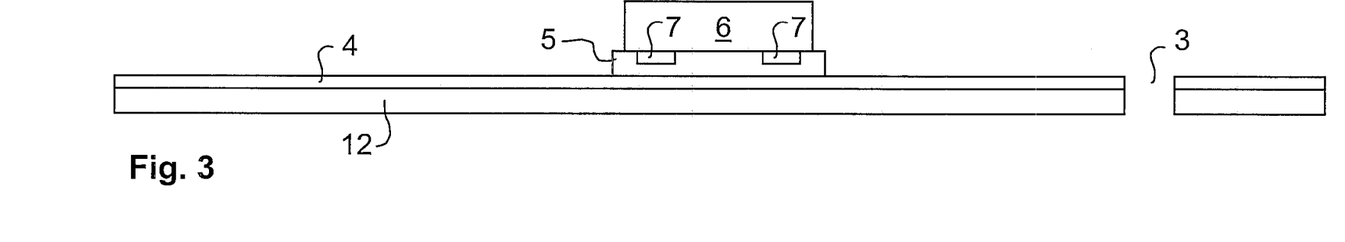
FIG. 3 shows an intermediate stage according to one embodiment, in which a component is glued to the adhesive layer of FIG. 2.
Figure 4:
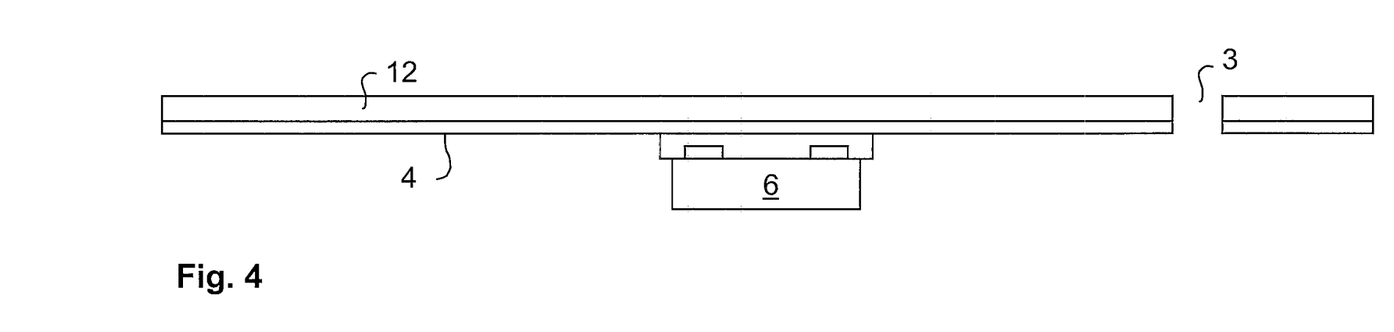
FIG. 4 shows the piece of FIG. 3 turned upside down.
Figure 7:
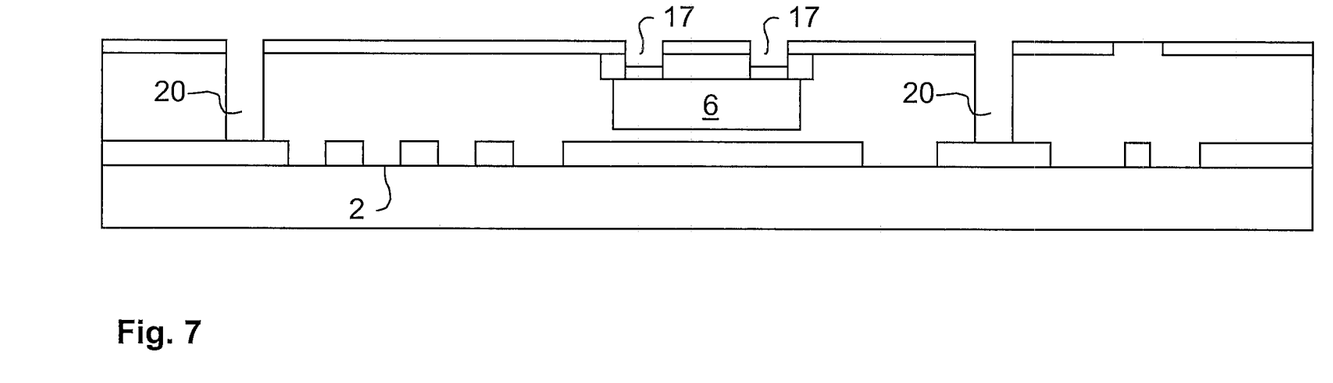
FIG. 7 shows an intermediate stage according to one embodiment, in which the support layer of the conductor layer has been removed and in which contact openings have been made to made contacts to the component and holes for the vias.

In a first embodiment, (not shown in the figures) contact openings are made in the conductor layer 4 at the positions of the contact areas 7 of the component 6 to be attached (compare FIGS. 3 and 7). The contact openings are thus made before the component 6 is attached to the conductor layer. The contact openings can be made, for example, by drilling with the aid of a laser. The mutual positioning of the contact openings is selected according to the mutual positions of the contact areas 7 of the component and the position and alignment of each group of contact openings is selected in such a way that the component is positioned correctly relative to the entire electronic module. In a more conventional embodiment, one contact opening is made for each contact area 7 participating in the creating of each electrical contact, but embodiments also exist, in which several contact openings are made for a single contact area 7. Such embodiments having a plurality of contact openings for a single contact area are described in more detail later in this specification with reference to FIGS. 11 to 14.

The surface area of the contact openings to be made can be more or less as large as the surface area of the corresponding contact area 7. The surface area of the contact opening can, of course, also be selected to be smaller, or in some embodiments slightly larger than the surface area of the corresponding contact area 7. In embodiments having a plurality of contact openings for a single contact area, it is often desirable to design the surface area of the individual contact openings considerably smaller that the surface area of the corresponding contact area 7. The shape of the contact openings can be, for example, round, elliptic, oval, angular, or linear.

The contact openings can be drilled from the direction of the first or second surface of the conductor layer. If a support layer 12, which is thus on the second side of the conductor layer, is used in the embodiment, it may be preferable to drill the contact openings from the direction of the first surface, because the openings to be drilled need not then penetrate the support layer 12 completely. In such an embodiment, the contact openings open later, when the support layer 12 is removed. The contact openings can also be opened by thinning the material layer formed by the conductor layer 4 and the support layer 12 by etching it form the direction of the support layer. The conductor layer 4 and the support layer 12 can also be formed from a single material layer. The part of the material layer that corresponds to the support layer 12 is then removed and the contact openings opened. The contact openings are thus intended to extend through the entire conductor layer 4.

In a second embodiment, contacts openings are not made in the conductor layer 4 before the component is attached, instead contact openings 17 are made only after the attachment of the component (FIG. 7). In such an embodiment, suitable alignment marks are used to align the component. In both the first and the second embodiments, alignment openings 3 (FIG. 1) are made in the conductor layer, for the mutual alignment of the circuit-board layer and the conductor structures on the base surface 2. In both embodiments, the alignment openings can be made either before the attachment of the component 6 to the conductor layer, or after the attachment.

Figure 2:
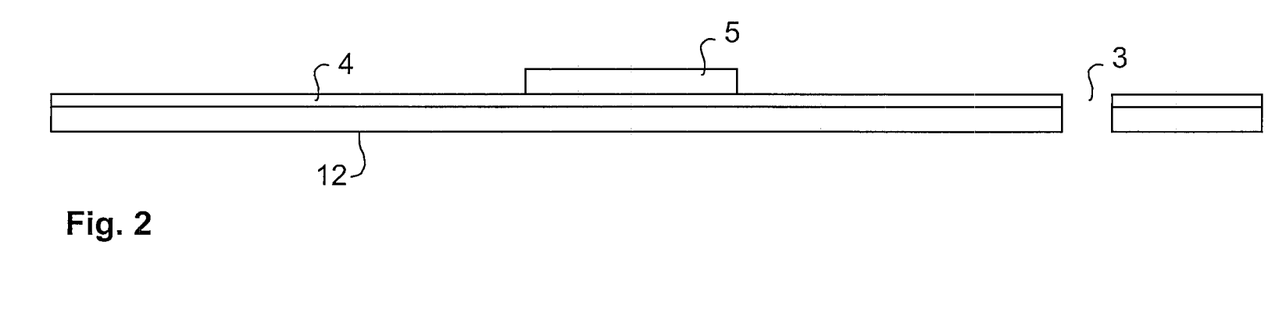
FIG. 2 shows an intermediate stage according to one embodiment, in which a local adhesive layer is added on top of the conductor layer of FIG. 1.

In both embodiments, the components 6 are attached to the surface of the conductor layer 4 with the aid of adhesive (FIG. 3). For gluing, an adhesive layer 5 is spread on the attachment surface of the conductor layer 4 or the attachment surface of the component 6, or on both attachment surfaces (FIG. 2).

After this, the components 6 can be aligned in the positions planned for the components 6 with the aid of the alignment marks.

The attachment surface of the component 6 refers to that surface of the components 6, which faces towards the conductor layer 4. The attachment surface of the component 6 comprises contact areas, by means of which an electrical contact can be made to the component. The contact areas can be, for example, flat areas on the surface of the component 6, or more usually contact protrusions, such as contact bumps, protruding from the surface of the component 6. Generally there are at least two contact areas or protrusions in a component 6. In complex microcircuits, there can be even a great many contact areas.

Generally it is preferable to spread so much adhesive on the attachment surface or attachment surfaces that the adhesive completely fills the space remaining between the component 6 and the conductor layer 4. There will then be no need for a separate filler agent. The filling of the space remaining between the components 6 and the conductor layer 4 reinforces the mechanical connection between the component 6 and the conductor layer 4, so that a mechanically more durable construction is obtained. A complete adhesive layer with no gaps will also support the conductor patterns 14 to be formed later in the conductor layer 4 and will protect the construction in later process stages. In the first embodiment, the adhesive will also enter the contact openings during gluing.

The term adhesive refers to a material, by means of which the components can be attached to the conductor layer. One property of the adhesive is that it can be spread on the surface of the conductor layer and/or the component in a relatively liquid form, or otherwise in a form that conforms to the surface shapes, for example in the form of a membrane. A second property of the adhesive is that, after spreading, the adhesive hardens, or can be hardened at least partly, in such a way that the adhesive can hold the component in place (relative to the conductor layer) at least until the component is attached to the construction in some other way. A third property of the adhesive is its adhesive ability, i.e. its ability to grip the surface being glued.

The term gluing refers to the attachment of the component and the conductor layer with the aid of an adhesive. When gluing, the adhesive is thus brought between the component and the conductor layer and the component is placed in a suitable position relative to the conductor layer, in which the adhesive is in contact with the component and the conductor layer and at least partly fills the space between the component and the conductor layer. After this, the adhesive is allowed to harden (at least partly), or the adhesive is actively cured (at least partly), in such a way that the component adheres with the aid of the adhesive to the conductor layer. In some embodiments, the contact protrusions of the component may protrude through the adhesive layer during gluing, to make contact with the conductor layer.

The adhesive used in the embodiments is, for example, a filled or unfilled thermosetting epoxy. The adhesive is selected in such a way that the adhesive used has a sufficient adhesion to the conductor membrane, circuit board, and component. One preferred property of the adhesive is a suitable thermal expansion coefficient, so that the thermal expansion of the adhesive will not differ too greatly from the thermal expansion of the surrounding material during the process. The adhesive selected should also preferably have a short hardening time, preferably of a few second at most. Within this time the adhesive should harden at least partly so that the adhesive will be able to hold the components in place. Final hardening can take clearly more time and the final hardening can even be planned to take place in connection with later process stages. The adhesive should also withstand the process temperatures used, for example heating to a temperature of 100-265° C. a few times, as well as other manufacturing-process stress, for example chemical or mechanical stress. The electrical conductivity of the adhesive is preferably in the order of the electrical conductivity of insulating materials.

A suitable insulating-material layer 1 is selected as the base material of the electronic module, for example, a circuit board. The insulating-material layer 1 can be made from a suitable polymer or a material containing a polymer. The manufacturing material of the insulating-material layer 1 can be, for example, in a liquid or pre-cured form (such as prepreg). Glass-fibre-reinforced sheets, such as FR4 of FR5-type sheets, can be used in the manufacture of the insulating-material layer 1. Other examples of materials, which can be used in the manufacture of the insulating-material layer 1 are PI (polyamide), aramid, polytetrafluoroethylene, and Teflon®. In place of or along with thermosetting plastics, thermoplastics can also be utilized in the manufacture of the insulating-material layer 1, for example, some suitable LCP (liquid crystal polymer).

Figure 5:
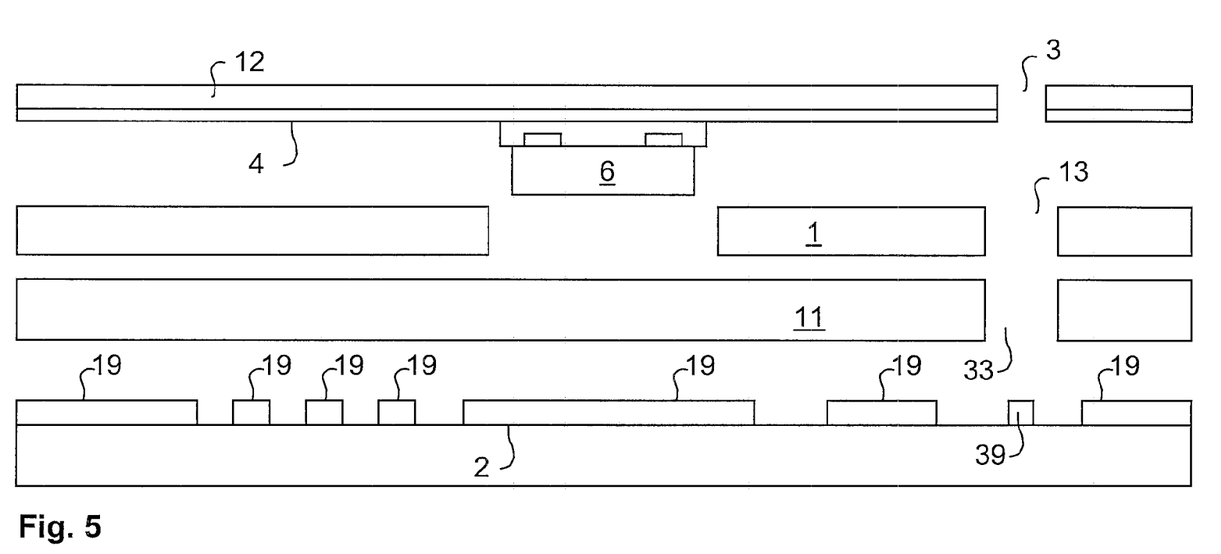
FIG. 5 shows an intermediate stage according to one embodiment, in which the piece of FIG. 4 is being attached to the base surface with the aid of insulating-material layers.

Recesses or through-holes selected according to the size and mutual positions of the components 6 glued to the conductor layer 4 are made in the insulating-material layer 1 using some suitable method (FIG. 5). The recesses or through-holes can also be made slightly larger than the components 6, in which case the alignment of the insulating-material layer 1 relative to the conductor layer 4 will not be so critical. If an insulating-material layer 1, in which through-holes are made for the components 6, is used in the process, certain advantages can be gained by using in addition a separate insulating-material layer 11, in which holes are not made. Such an insulating-material layer 11 can be located on top of the insulating-material layer to cover the through-holes made for the components.

Figure 6:
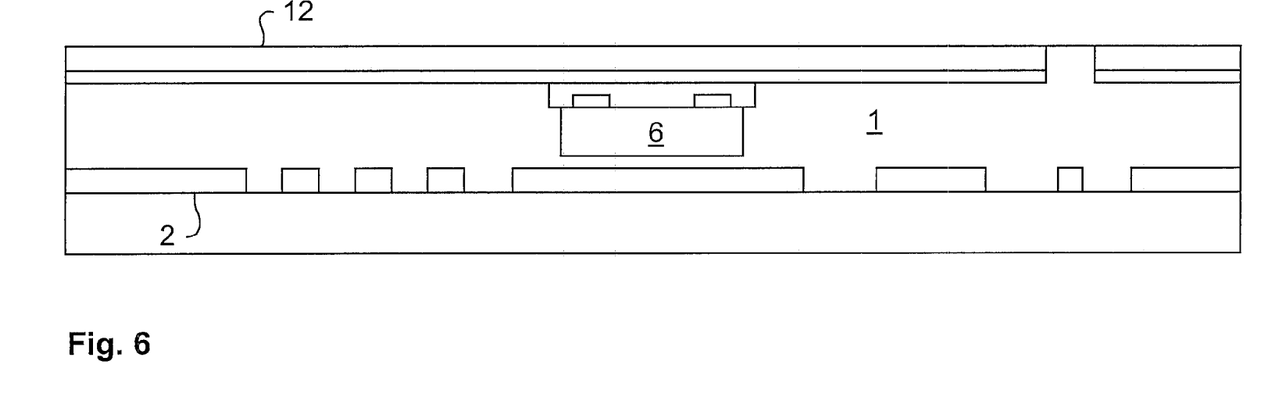
FIG. 6 shows an intermediate stage according to one embodiment, in which the piece of FIG. 4 is attached to the base surface with the aid of an insulating-material layer.

After this, the insulating material is hardened, so that an essentially unified insulating-material layer 1 is created (FIG. 6). The essentially unified insulating-material layer 1 is formed in both the embodiments using a single insulating-material sheet 1 and those using several insulating-material sheets 1, 11.

If the insulating-material layer 1 is not transparent, alignment openings 13 can be made in the insulating-material layer for the mutual alignment of the circuit-board layer and the conductor structures on the base surface 2. This procedure can be used in both the first and second embodiments. In a corresponding manner, when using an insulating-material layer 11, alignment openings 33 can be made in it. The alignment openings 13 and the alignment openings 33 are positioned according to the alignment marks 39 on the base surface. When the insulating material layer 1 or the insulating-material layers 1, 11 are placed on top of the base surface 2 in such a way that the alignment openings 13 and, if necessary, also the alignment openings 33 are set in the same position as the alignment mark 39, the conductor layer 4 can be aligned accurately relative to the base surface 2, through the alignment opening 3. Alignment can also be performed, for example, with the aid of alignment pins located in the edge areas of the entire sheet being aligned.

Another alternative for alignment is to bring the conductor layer 4 into the correct position relative to the base surface 2 by aligning it through an alignment opening 3 and holding the conductor layer 4 in place in the correct position above the base surface 2. After this, an at least partly unhardened insulating-material sheet 1 can be brought between the conductor layer 4 and the base surface 2 and the layers pressed together. If, when pressing, the conductor layer 4 and the base surface 2 are not allowed to move laterally relative to each other, the conductor layer 4 and the base surface 2 will come to the correct position relative to each other. In such an embodiment, the insulating-material layer 1 need not necessarily include alignment openings 13. Correspondingly alignment openings 33 will also not be needed when using a second insulating-material layer 11.

After the attachment of the layers, microvias are made in the electronic module, through which electrical contacts can be made between the contact areas of the components 6 and the conductor layer 4.

For making the vias, the contact openings 17 in the first embodiment are cleaned of adhesive and other materials that may have entered the openings. This naturally takes place from the direction of the second surface of the conductor material 4, as the components are glued to the first side. In connection with the cleaning of the contact openings, it is also possible to clean the contact areas 7 of the components 6, which will further improve the conditions for making a high-quality electrical contact. Cleaning can take place, for example, using a plasma technique, chemically, or with the aid of a laser. If the contact openings and contact areas are already sufficiently clean, cleaning can naturally be omitted.

At this stage in the second embodiment contact openings 17 are made through the conductor layer 4 (FIG. 7). The contact openings 17 are aligned, for example, with the aid of alignment openings 3. The contact openings 17 can be made, for example, with the aid of a laser.

In connection with the manufacture or cleaning of the contact openings 17, it is also possible to make holes for the vias to be formed between the conductor-pattern layer 14 and a conductor structure 19 on the base surface 2.

After this, it is possible to examine the success of the alignment of the component 6, if this is desired. This is based on the fact that well aligned contact areas 7 of a component 6 will be visible through the contact openings 17 when viewed from the direction of the conductor layer 4.

Figure 8:
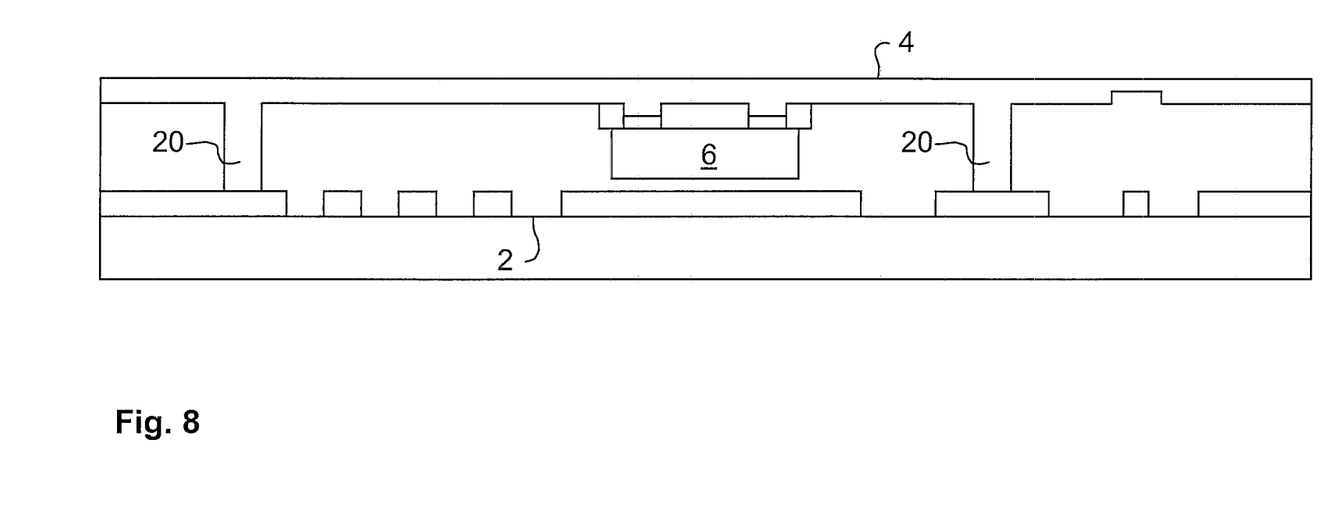
FIG. 8 shows an intermediate stage according to one embodiment, in which conductor material is made on top of the contact openings, vias, and conductor layer of FIG. 7.

After the contact openings have been cleaned in the first embodiment (if this is necessary), or, in the second embodiment after the contact openings have been made, conductive material is brought to the contact openings 17, in such a way that it forms an electrical contact between the component 6 and the conductor layer 4. In the same connection, it is possible to make conductors also to the vias 20. The conductive material can be made, for example, by filling the contact openings with an electrically conductive paste. The conductive material can also be made by using some of the growing methods known in the circuit-board industry. At the present moment, best electrical contacts are made by creating a metallurgical joint, for example, by growing the conductive material using a chemical or electrochemical method. Such methods are thus attempted to be used in at least the most demanding applications. One good alternative is the growth of a thin layer using a chemical method and continuing the growth using a more economical electrochemical method. In addition to these methods, it is of course possible to also use some other method, which is of benefit in terms of the final result. At the same time, the thickness of the conductor layer 4 can also be increased (FIG. 8).

Figure 9:
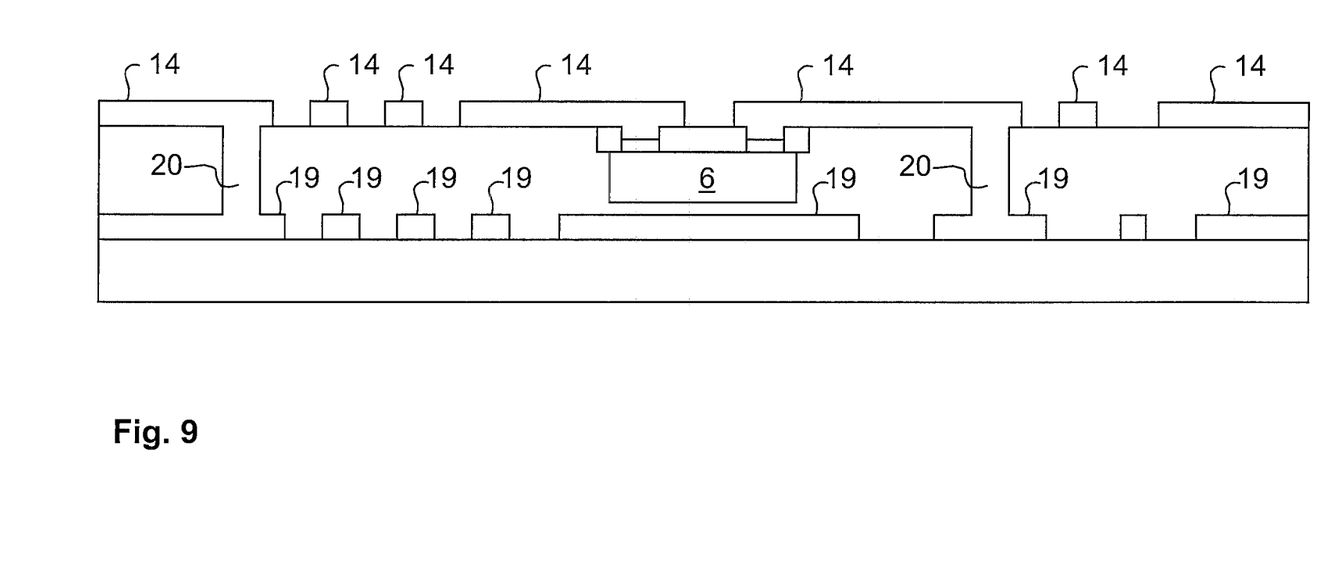
FIG. 9 shows a piece according to one embodiment, in which the conductor layer on the surface of the piece shown in FIG. 8 is patterned to form a conductor-pattern layer.

After this, the conductor layer 4 can be patterned to form a conductor-pattern layer 14 (FIG. 9).

When manufacturing a circuit-board layer according to the first embodiment, it is also possible to exploit in the manufacture of the circuit-board layer the manufacturing method that is disclosed in the same applicant's U.S. patent application Ser. No. 10/550,023, which is incorporated herein by reference.

When manufacturing a circuit-board layer according to the second embodiment, it is also possible to exploit in the manufacture of the circuit-board layer the manufacturing method that is disclosed in the same applicant's U.S. patent application Ser. No. 11/570,673, which is also incorporated herein by reference.

Figure 11:
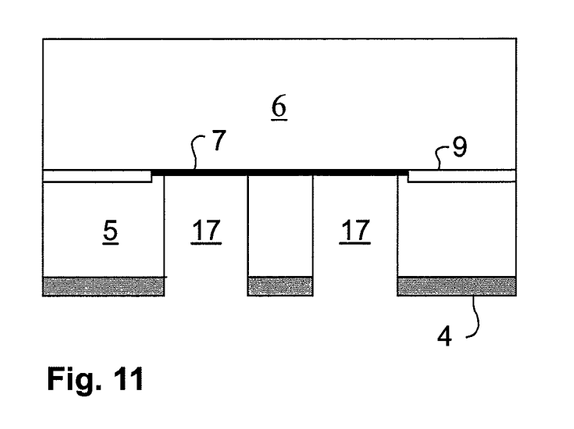
FIG. 11 shows a detail according to an embodiment, wherein the electronic module comprises a plurality of contact elements in contact with a common contact area.

FIG. 11 relates to an embodiment wherein a plurality of electrical contact elements are connected to a common contact area 7 or contact bump. FIG. 11 shows in cross-section a detail of the structure at an intermediate phase of the manufacturing process. According to FIG. 11, the component 6 has a first surface with a plurality of contact areas 7 or other contact terminals (one of which is shown) and a passivation layer 9 covering the first surface outside the contact areas 7. FIG. 11 also shows a conductor layer 4, from which conductor patterns 14 are later made. Furthermore, there is presented a layer of hardened adhesive between the first surface of the component 6 and the conductor layer 4. The structure also includes a plurality of contact openings 17 for an individual contact area 7. Two of the plurality of contact openings 17 are visible in FIG. 11. The contact openings 17 are perfectly aligned with regard to the contact area 7.

Figure 12:
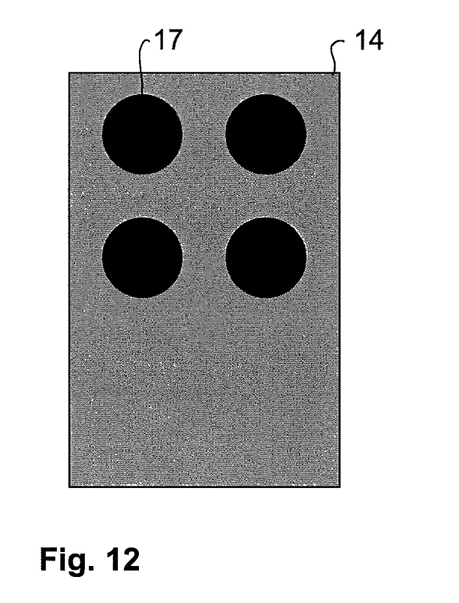
FIG. 12 shows an example of perfect alignment relating to the embodiment of FIG. 11.

FIG. 12 shows the structure of FIG. 11 after filling the contact openings 17 with conductive material and after patterning the conductor layer 4 to form conductor patterns 14. FIG. 12 shows one of such conductor patterns 14 perfectly aligned with regard to the contact area 7 and contact openings 17. The conductor pattern 14 conducts electrical signals to between the component 6 and other circuitry outside the component 6.

There are two relevant alignment steps when manufacturing the structures of FIGS. 11 and 12. First, the contact openings 17 have to be aligned with regard to the contact area 7. When the contact openings 17 are prepared before the attachment of the component 6, this alignment step can be reliably done with a very good accuracy. This is because the contact openings 17 are clearly visible to the machine and then the component can be accurately placed with regard to the contact openings 17. Furthermore, it is possible to confirm alignment by inspection via the contact openings 17. Therefore, the first alignment is not usually problematic.

After the first alignment, the contact openings 17 are filled. In case this is at least partly done by electroplating, the material can also be grown on the surface of the conductor layer 4. Then, the contrast visible to the machine eye between the location of the contact opening 17 and the other conductor 4 is reduced, and this may sometimes cause problems in alignment.

Figure 13:
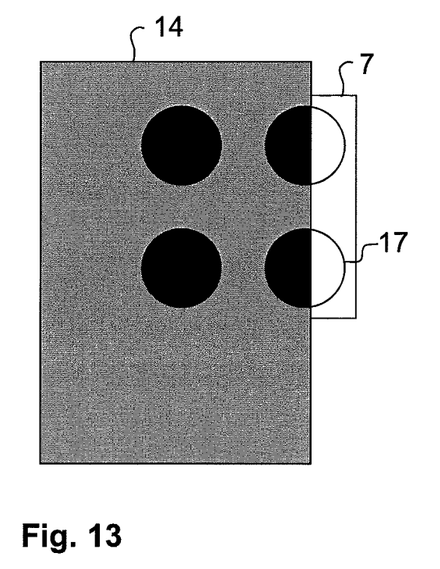
FIG. 13 shows an example of misalignment relating to the embodiment of FIG. 11.

FIG. 13 shows an example of misalignment between the conductor pattern 14 and the contact area 7. Due to this misalignment, two of the electrical contacts made in the contact openings 17 are only partially covered by the conductor pattern 14. This situation may cause a break-down of the contact element as the etch used for patterning the conductor layer 4 attacks also the material of the contact element. Therefore, the two "right-side" contacts are unreliable. Instead, the two "left-side" contacts have been protected by the conductor layer 4 and a resist layer on top of it during the etching. Therefore, these two contacts are reliable.

Figure 14:
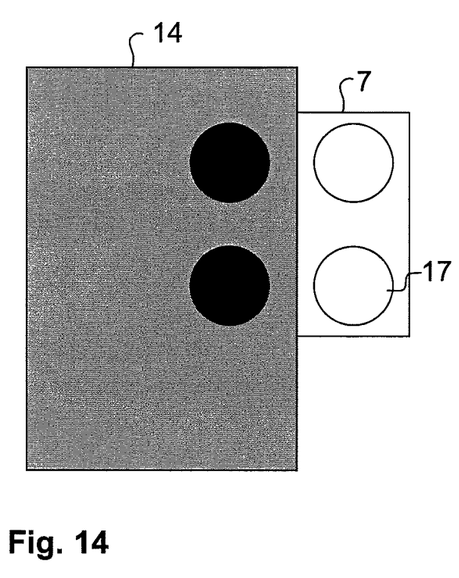
FIG. 14 shows another example of misalignment relating to the embodiment of FIG. 11.

FIG. 14 shows an example of an even greater inaccuracy in alignment. However, also in this case there are two perfectly made contacts (the "left-side" contacts in the Figure).

FIGS. 13 and 14 exemplify a benefit of the embodiment wherein there are more than one contact element for an individual contact area 7. In case the four contact elements in FIGS. 13 and 14 are replaced by one single contact element with a greater size, we notice that such bigger contact element is more easily partly revealed during the etching step and therefore attacked by the etch. In an embodiment replacing the sole contact element with a plurality of contact elements, it is very likely that at least some of the individual contact elements remain protected under the resist also in misalignment situations. Thus, according to an embodiment, there are provided a plurality of contact elements to make contact with a common contact area 7. This plurality may consist of for example, four or nine contact elements. More generally, the number of contact elements is said plurality of contact elements may be any number greater than one.

The examples described above depict some of the possible processes, which the aid of which our invention can be exploited. However, our invention is not restricted to only the first and second embodiments described above, but instead the invention also covers other different processes and their end products, taking into account the full extent and equivalence interpretation of the Claims. The invention is also not restricted to only the constructions and methods depicted by the examples, but it will be obvious to one versed in the art that various applications of our invention can be used to manufacture a great variety of electronic modules and circuit boards, which differ even greatly from the examples presented. The components and circuits of the figures are thus shown only with the intention of illustrating the manufacturing process. Thus a great many changes can be made to the processes of the examples described above, while nevertheless not deviating from the basic idea according to the invention. The changes can relate, for example, to the manufacturing techniques described in the various stages, or to the mutual sequence of the process stages.

Figure 10:
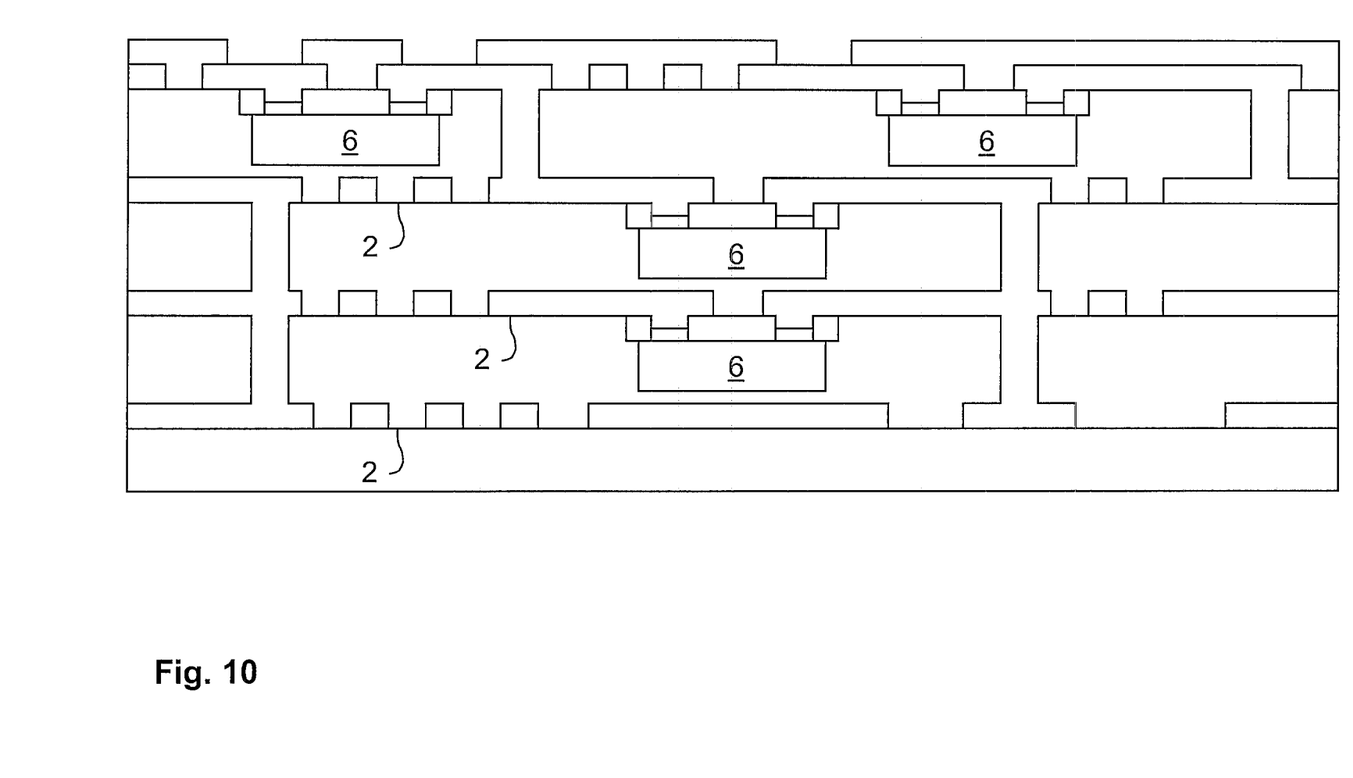
FIG. 10 shows an electronic module according to one embodiment, in which three circuit-board layers have been made on top of each other on the base surface.

The circuit-board layer manufacturing method described above can also be repeated, in such a way that circuit-board layers are made on top of each other. In this way it is possible to manufacture, for example, constructions like that shown in FIG. 10, which comprise circuit-board layers on top of each other, connected to each other electrically, which contain components.

Circuit-board layers can thus be added on top of very different base surfaces 2. The base surface 2 can also be a curved surface, as in the embodiments presented above the electrical contact between the component and the related conductor layer will not be damaged due to the bending of the conductor layer. This is based on the fact that the electrical contact is made only after the bending of the conductor layer.

The invention claimed is:

1. A circuit board, comprising:
a conductor-pattern layer;
an insulating-material layer supporting the conductor-pattern layer;
at least one component inside the insulating-material layer, the component having a plurality of contact areas;
a set of contact elements between the conductor-pattern layer and contact areas for electrically connecting the conductor-pattern layer and the at least one component;
wherein the set of contact elements comprise a plurality of individual contact elements for at least one single contact area in said plurality of contact areas.

2. The circuit board of claim 1, comprising hardened insulating adhesive between the conductor-pattern layer and contact areas of the component, the set of contact elements passing through the hardened insulating adhesive.

3. The circuit board of claim 2, wherein the hardened insulating adhesive fills the space between the conductor-pattern layer and the component.

4. The circuit board of claim 1, wherein
the component has a first surface on which said plurality of contact areas are located;
the first surface of the component faces the conductor-pattern layer; and
each contact element in said set of contact elements extends from the respective contact area to the conductor-pattern layer at right angles to said first surface of the component.

5. The circuit board of claim 1, wherein
the component is a semiconductor component having a first surface and said plurality of contact areas located on said first surface;
said plurality of contact areas are separated from the conductor-pattern layer by a space; and
said space is filled by hardened insulating adhesive and said set of contact elements passing through the hardened insulating adhesive, said contact element extending from the respective contact area to the conductor-pattern layer at right angles to said first surface of the semiconductor component.

6. The circuit board of claim 1, wherein
the set of contact elements comprises a first plurality of individual contact elements for a first individual contact area in said plurality of contact areas; and
the set of contact elements comprises a second plurality of individual contact elements for a second individual contact area in said plurality of contact areas.

7. The circuit board of claim 1, wherein each contact element in the set of contact elements contains a first layer of metal and a second layer of metal.

8. The circuit board of claim 1, wherein each contact element in the set of contact elements is in metallurgical contact with the respective contact area and a respective conductor of the conductor-pattern layer.

9. The circuit board of claim 8, wherein each contact element in the set of contact elements is in said metallurgical contact via a contact surface, the contact surface being round in shape.

10. A circuit board, comprising:
a conductor-pattern layer;
an insulating-material layer supporting the conductor-pattern layer;
at least one component inside the insulating-material layer, the component having a plurality of contact areas;
contact elements between the conductor-pattern layer and contact areas for electrically connecting the conductor-pattern layer and the at least one component;
wherein at least two of the contact elements are in direct contact with a common contact area.

11. The circuit board of claim 10, wherein said at least two contact elements are in metallurgical contact with said common contact area.

12. The circuit board of claim 11, wherein each of said at least two contact elements comprise a first layer of metal and a second layer of metal.

13. The circuit board of claim 11, wherein said at least two contact elements extend through a layer of hardened insulating adhesive.

14. The circuit board of claim 11, wherein said at least two contact elements extend from the common contact area at right angles to said common contact area.

15. The circuit board of claim 10, wherein
said at least one component comprises at least one semiconductor component; and
said at least two contact elements are in direct contact with the common contact area of the at least one semiconductor component through a round contact surface.

16. An electronic module, comprising:
an insulating-material layer;
at least one semiconductor component inside the insulating-material layer, the semiconductor component having a plurality of contact areas;
a conductor-pattern layer running over the insulating-material layer and comprising a plurality of conductors;
contact elements between the conductor-pattern layer and contact areas;
wherein at least one of the conductors is electrically connected to an individual contact area via a plurality of said contact elements.

17. The electronic module of claim 16, wherein
the electronic module comprises at least one layer of hardened insulating adhesive between the conductor-pattern layer and the component; and
said plurality of contact elements pass through said at least one layer of hardened insulating adhesive, extending at right angles to said individual contact area.

18. The electronic module of claim 17, wherein said at least one layer of hardened insulating adhesive is in direct contact with the conductor-pattern layer and the component.

19. The electronic module of claim 17, wherein each contact element contains a first layer of metal and a second layer of metal.

20. The electronic module of claim 17, wherein each contact element has a round cross-section.

* * * * *

UNITED STATES PATENT AND TRADEMARK OFFICE
CERTIFICATE OF CORRECTION

| | | |
|---|---|---|
| PATENT NO. | : 8,487,194 B2 | Page 1 of 1 |
| APPLICATION NO. | : 12/702653 | |
| DATED | : July 16, 2013 | |
| INVENTOR(S) | : Risto Tuominen et al. | |

It is certified that error appears in the above-identified patent and that said Letters Patent is hereby corrected as shown below:

ON THE TITLE PAGE:

Please insert the following:

-- (30)     Foreign Application Priority Data

Aug. 5, 2004   (FI)   ................. 20041059 --.

Signed and Sealed this
Twelfth Day of November, 2013

Teresa Stanek Rea
*Deputy Director of the United States Patent and Trademark Office*